United States Patent [19]

Fenderson et al.

[11] 4,326,169
[45] Apr. 20, 1982

[54] ADAPTIVE DECISION LEVEL CIRCUIT

[75] Inventors: Gerald L. Fenderson, Newton; Mitchell A. Skinner, Seabrook, both of N.H.

[73] Assignee: Bell Telephone Laboratories, Incorporated, Murray Hill, N.J.

[21] Appl. No.: 127,936

[22] Filed: Mar. 7, 1980

[51] Int. Cl.$^3$ .......................... H03K 5/08; H03K 5/22
[52] U.S. Cl. ................................. 328/162; 307/359; 328/164; 328/167
[58] Field of Search ............... 307/354, 359, 360, 361, 307/264, 268; 328/162, 164, 165, 167

[56] References Cited

U.S. PATENT DOCUMENTS 3,534,273 10/1970 Thomas .............................. 328/162
4,263,555 4/1981 Hunka ............................ 307/359 X

OTHER PUBLICATIONS

M. A. Byington et al., Design and Performance of A 16-State Digital Modem ICC Conference Record, vol. 1, 1979 pp. 5.4.1–5.4.6.
M. Washio et al., 1.6 Gbls 16-Level Superposed APSK Modem with Baseband Signal Processing Coherent Demodulator, IEEE MTT-S International Microwave Symposium, vol MTT-26 No. 12, Dec. 1978 pp. 945–951.
W. B. Gaunt et al., The D3 Channel Bank, Bell Laboratories Record, vol. 50, No. 7, Aug. 1972 pp. 229–233.

Primary Examiner—John Zazworsky
Attorney, Agent, or Firm—David R. Padnes

[57] ABSTRACT

The adaptive decision level circuit (FIG. 3) slices a digital signal with respect to a decision level disposed between the signal levels. A correction signal generated from the sliced signals (S, $\bar{S}$) compensates for variations in the signal levels by maintaining the decision level at a constant position relative to the signal levels. The correction signal is generated by comparing (321) the integrated difference (on lead 305) between the sliced signal and its complement with the statistically expected value (312) of the difference between the sliced signal and its complement. In the preferred embodiment, the expected value is equal to one-half the signal swing of the sliced signal.

6 Claims, 3 Drawing Figures

ADAPTIVE DECISION LEVEL CIRCUIT

TECHNICAL FIELD

This invention relates to digital transmission systems and, in particular, to receiver apparatus for automatically adjusting a decision level for minimum errors in signal level detection.

BACKGROUND OF THE INVENTION

The regeneration of digital signals requires the ability to distinguish between signal levels. Such ability is often provided by slicing circuitry within the receiver which quantizes the digital signal with respect to a decision level disposed between the signal levels. In prior art transmission systems, e.g., the T1 transmission system described in an article entitled "The D3 Channel Bank", Bell Laboratories Record, Vol. 50, No. 7, April 1972, pg. 229-233, factors such as noise, variations in temperature and/or voltage produce variations in the received signal levels. Such variations can cause errors in signal level detection. Compensation for these signal level changes, therefore, is required for minimizing quantization errors.

SUMMARY OF THE INVENTION

The present invention addresses itself to the problem of digital signal quantization errors through the use of an adaptive decision level circuit. A slicer first quantizes the digital signal with respect to a decision level disposed between two signal levels and generates a complementary pair of two level signals. Feedback circuitry then utilizes the slicer output to generate a correction signal which automatically maintains the decision level at a constant position relative to the signal levels.

The feedback circuitry comprises a difference integrator, reference generator and comparator. The correction signal is generated by comparing the integrated difference between the sliced signal and its complement with a reference signal. This reference signal is set at the expected value of the difference between the sliced signal and its complement. In the preferred embodiment, this expected value is determined by assuming an equal probability of any signal level with time.

A feature of the present invention is its adaptability to multi-level digital systems.

It is also a feature of the present invention that the reference signal is produced using the slicer output in lieu of the slicer input to eliminate any errors caused by non-linearities in slicer performance.

A further feature of the present invention is that temperature and voltage tracking can be readily provided by designing the reference generator and comparator with solid state devices identical to those used for the slicer and difference integrator, respectively.

Another feature of the present invention is that digital signal distortions caused by Nyquist filtering can readily be compensated for.

DETAILED DESCRIPTION

Figure 1:
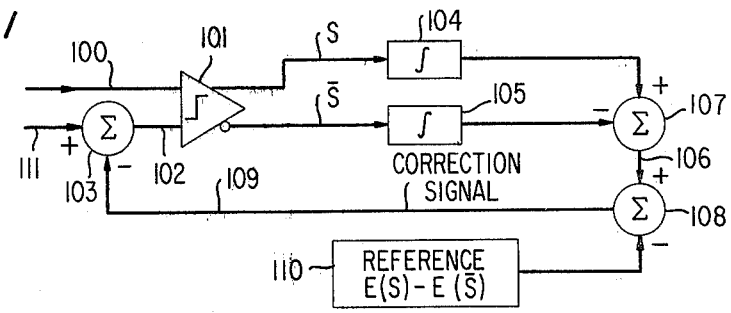
FIG. 1 illustrates a simplified schematic block diagram in accordance with the present invention.
Figure 2:
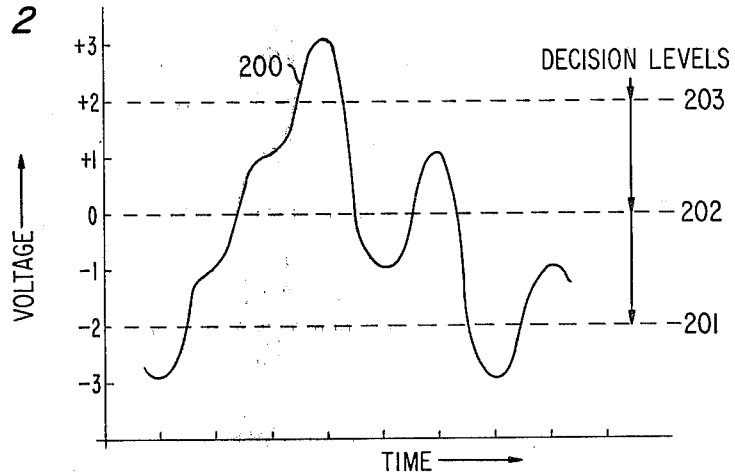
FIG. 2 shows a typical quaternary digital data signal.

Referring to FIG. 1, a multi-level digital signal, in this case a quaternary signal, is coupled to input terminal 100 of slicer 101. An illustrative quaternary signal, as shown in FIG. 2, consists of four signal levels nominally represented by $\pm 1$ and $\pm 3$ volts. In existing transmission systems, these signal levels are not constant but vary about the nominal voltage values due to a variety of factors, such as noise and fluctuations in temperature and supply voltage.

Detection of four different signal levels requires the use of three decision levels, each disposed at a preselected position between successive signal levels. Such preselected positions are often midway between the nominal signal level voltages as shown by decision levels 201, 202 and 203. Minimization of signal level detection errors requires adjustment of each decision level to compensate for variations in the amplitude of adjacent signal levels. Ideally, this adjustment should maintain each decision level in a constant position relative to adjacent signal levels.

Returning to FIG. 1, slicer 101 quantizes the quaternary signal with respect to a given decision level on slicer input 102. The nominal voltage value of this decision level is supplied to lead 111. Summer 103 provides slicer input 102 with the algebraic sum of this nominal voltage along with the correction signal on lead 109. The output of slicer 101 is a complementary pair of two level signals, designated as S and $\bar{S}$, which are fed to other circuitry for signal processing. Aside from being the circuit output, signals S and $\bar{S}$ are also coupled to feedback circuitry which generates an error signal to maintain the decision level at an optimum position for minimum quantization errors.

The error signal is generated by comparing the integrated difference between S and $\bar{S}$ with a reference signal. Integration of S and $\bar{S}$ is provided by integrators 104 and 105, respectively. Summer 107 generates the integrated difference at output 106. The correction signal, in turn, is generated by summer 108 from the summing of output 106 with the reference signal generated by unit 110.

The reference signal generated by unit 110 is equal to the expected value of $S-\bar{S}$, designated as $E(S-\bar{S})$. This expected value can be produced from a determination of the data statistics. In the preferred embodiment, $E(S-\bar{S})$ is generated assuming a uniform probability of signal levels and a square waveform for the input signal. With these assumptions, $E(S)$ for a slicer quantizing an input signal with respect to decision level 203 is:

$$E(S) = \frac{x}{4} + \frac{3y}{4}, \quad (1)$$

where x and y are the high and low output levels of slicer 101.

Similarly, the expected value of the complementary signal $\bar{S}$ is:

$$E(\bar{S}) = \frac{3x}{4} + \frac{y}{4}. \quad (2)$$

Consequently, the difference between Equations 1 and 2 yields $$E(S - \overline{S}) = \frac{y-x}{2} = \frac{\Delta}{2}, \qquad (3)$$

where $\Delta$ is the voltage output swing of slicer 101.

Figure 3:
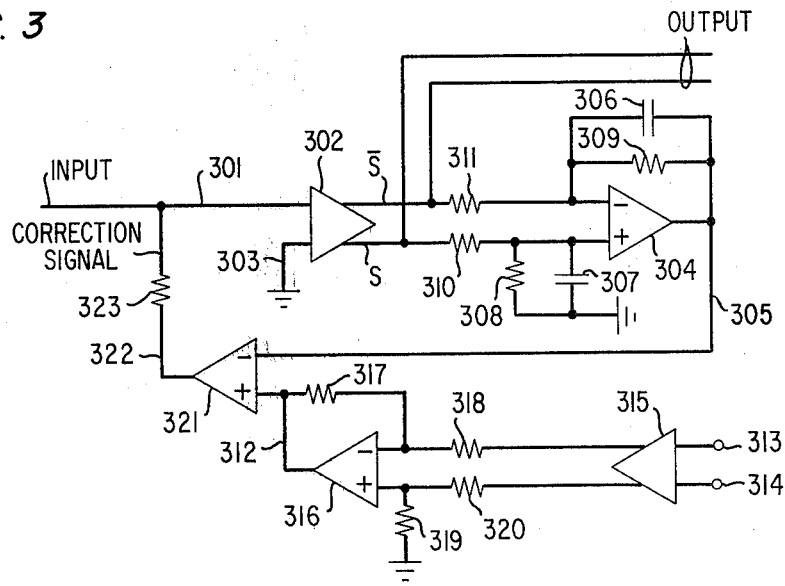
FIG. 3 is a detailed schematic diagram of circuitry pursuant to the present invention.

The detailed schematic of a preferred embodiment of the invention is illustrated in FIG. 3. The four level input signal, along with correction signal from the output of comparator 321, is applied to input lead 301 of slicer 302. Slicer 302 is preferably a high-speed, high-gain differential amplifier. Input 303 of slicer 302 is tied to ground. This arrangement of the correction signal to the slicer input is just one of many alternatives to that shown in FIG. 1. In the FIG. 3 configuration, the error signal drives the decision level toward the nominal voltage in addition to providing adjustments thereto. Slicer 302 provides a pair of two level complementary output signals S and $\overline{S}$ which are the circuit output. Signals S and $\overline{S}$ are also coupled to the integrator 304 which generates the integration of S-$\overline{S}$ on output lead 305. The time constant of integrator 304 can be adjusted by the selection of capacitors 306 and 307 and resistors 308 and 309. Resistors 310 and 311, disposed in series with the inputs to integrator 304, are used to provide compensation for waveform distortions caused by Nyquist filtering of the input signal. For example, if the input signal on lead 301 was previously coupled through a 45% cosine roll-off filter, the ratio of the values of resistors 309/311 and 308/310 should be 0.873.

The reference signal is produced on lead 312 by the operation of slicer 315 and differential amplifier 316. Slicer 315 is supplied with the high and low output voltages of slicer 302 via inputs 313 and 314, respectively. Preferably, slicer 315 and slicer 302 are identical devices so that reference signal tracks the temperature and supply voltage induced variations in slicer 302 performance. The outputs of slicer 315, in turn, are supplied to differential amplifier 316. The desired $\Delta/2$ reference signal on lead 312 is obtained by setting the ratio of resistors 317/318 and 319/320 to $\frac{1}{2}$. It should also be noted that the value of resistors 317/318, and 319/320 can be adjusted to a value of 0.573 to compensate for Nyquist filtering distortions in lieu of the technique previously discussed. Moreover, the ratio of resistors 317/318 and 319/320 can be adjusted to set the decision level at any preselected position between signal levels.

Comparator 321 generates correction signal at output 322 by a comparison of the reference signal with the output of integrator 304. This correction signal is supplied through resistor 323 to input lead 301. During circuit start-up, the initial correction signal will increase until the nominal decision level is reached. Once this nominal value is achieved, the correction signal generated will adjust the decision level to compensate for signal level variations.

The preferred embodiment has been discussed in reference to operation about decision level 203. Operation about any decision level in a multi-level digital system can be easily provided. For a quaternary signal such as shown in FIG. 2, three decision level circuits in parallel are used to quantize the signal with respect to decision levels 201, 202 and 203. Quantizing about decision level 202 requires that inputs 313 and 314 be adjusted to 0 volts and quantizing about decision level 201 requires setting inputs 313 and 314 to the low and high voltage output levels of slicer 302, respectively. As used herein, the term "multi-level" should be understood to include any digital system having more than two signal levels. It should further be obvious to those skilled in the art that the principles of the present invention are not limited to multi-level systems but are also applicable to binary digital systems, i.e., systems with two signal levels.

I claim:

1. In a system for receiving digital signals at a number of signal levels, an adaptive decision level circuit for quantizing said digital signals about a decision level interposed between successive ones of said signal levels comprising
    means (101) for slicing said digital signals with respect to said decision level and generating a complementary pair of signals (S and $\overline{S}$) each capable of taking on a high and low output value (x,y), and being further CHARACTERIZED BY,
    means for integrating (104, 105, 107) the difference between said complementary pair of signals,
    means (110) for generating the expected value of the difference between said complementary pair of signals based on said decision level, the recited expected value being equal to the difference between said high and low output value times a proportionality constant, said constant being a function of the number of said signal levels higher and lower than said decision level, and
    means (108) for comparing the integrated difference of said complementary pair of signals with the expected value of the difference between said complementary pair of signals and generating a correction signal therefrom to maintain said decision level at a constant position relative to said successive levels.

2. The circuit of claim 1 further CHARACTERIZED BY means for compensating for digital signal waveform distortion caused by Nyquist filtering.

3. The circuit of claim 2 wherein said decision level is centrally disposed between successive ones of said multi-levels.

4. The circuit of claim 3 wherein said expected value of the difference between said complementary pair of 2-level signals is equal to the signal swing of said slicing means divided by two.

5. The circuit of claim 4 wherein said generating means comprises second slicing means substantially identical to the first-recited slicing means.

6. The circuit of claim 1 wherein said proportionality constant is equal to the difference between the number of signal levels higher than said decision level and the number of signal levels lower than said decision level divided by said number of signal levels.

* * * * *